(12) United States Patent
Toprac

(10) Patent No.: US 6,427,093 B1
(45) Date of Patent: Jul. 30, 2002

(54) METHOD AND APPARATUS FOR OPTIMAL WAFER-BY-WAFER PROCESSING

(75) Inventor: Anthony J. Toprac, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/414,107

(22) Filed: Oct. 7, 1999

(51) Int. Cl.$^7$ .......................... G06F 19/00; G06F 13/02; H01L 21/00
(52) U.S. Cl. .......................... 700/121; 700/45; 700/108; 438/5
(58) Field of Search ..................... 700/44, 45, 108–110, 700/121, 174, 193; 438/5, 14

(56) References Cited

U.S. PATENT DOCUMENTS

| | | | | |
|---|---|---|---|---|
| 5,661,669 A | * | 8/1997 | Mozumder et al. | 204/192.13 |
| 5,740,065 A | * | 4/1998 | Jang et al. | 355/53 |
| 5,751,582 A | * | 5/1998 | Saxena et al. | 700/109 |
| 5,910,011 A | * | 6/1999 | Cruse | 438/14 |
| 5,923,553 A | * | 7/1999 | Yi | 700/110 |
| 5,999,003 A | * | 12/1999 | Steffan et al. | 324/537 |
| 6,240,330 B1 | * | 5/2001 | Kurtzberg et al. | 700/105 |
| 6,292,708 B1 | * | 9/2001 | Allen et al. | 318/568.11 |

* cited by examiner

Primary Examiner—Leo Picard
Assistant Examiner—Elliot Frank
(74) Attorney, Agent, or Firm—Williams, Morgan & Amerson, P.C.

(57) ABSTRACT

The present invention provides for a method and an apparatus for optimal wafer-by-wafer processing. Semiconductor devices are identified for wafer-by-wafer analysis. At least one value of a controlled variable in the wafer-by-wafer analysis is identified. A trajectory of recipes is created for the identified semiconductor devices. A feedback implementation of wafer-by-wafer control is performed using the trajectory of recipes upon the identified semiconductor devices. A feed-forward implementation of wafer-by-wafer control is performed using the trajectory of recipes upon the identified semiconductor devices.

41 Claims, 5 Drawing Sheets

METHOD AND APPARATUS FOR OPTIMAL WAFER-BY-WAFER PROCESSING

BACKGROUND OF THE INVENTION

1. Field of the Invention

This invention relates generally to semiconductor products manufacturing, and, more particularly, to a method and means for automated error correction for wafer-by-wafer processing.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the factors that affect semiconductor device manufacturing are wafer-to-wafer variation that are caused by manufacturing problems that include start-up effects of manufacturing machine tools, memory effects of manufacturing chambers, and first-wafer effects. One of the process steps that are adversely affected by such factors is the photolithography overlay process. Overlay is one of several important steps in the photolithography area of semiconductor manufacturing. Overlay control involves measuring the misalignment between two successive patterned layers on the surface of a semiconductor device. Generally, minimization of misalignment errors is important to ensure that the multiple layers of the semiconductor devices are connected and functional. As technology facilitates smaller critical dimensions for semiconductor devices, the need for reduced of misalignment errors increases dramatically.

Generally, photolithography engineers currently analyze the overlay errors a few times a month. The results from the analysis of the overlay errors are used to make updates to exposure tool settings manually. Some of the problems associated with the current methods include the fact that the exposure tool settings are only updated a few times a month. Furthermore, currently the exposure tool updates are performed manually.

Generally, a set of processing steps is performed on a lot of wafers on a semiconductor manufacturing tool called an exposure tool or a stepper. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework. The machine interface can generally be part of an advanced process control (APC) system. The APC system initiates a control script, which can be a software program that automatically retrieves the data needed to execute a manufacturing process. The input parameters that control the manufacturing process are revised periodically in a manual fashion. As the need for higher precision manufacturing processes are required, improved methods are needed to revise input parameters that control manufacturing processes in a more automated and timely manner. Furthermore, wafer-to-wafer manufacturing variations can cause non-uniform quality of semiconductor devices.

The present invention is directed to overcoming, or at least reducing the effects of, one or more of the problems set forth above.

SUMMARY OF THE INVENTION

In one aspect of the present invention, a method is provided for optimal wafer-by-wafer processing. Semiconductor devices are identified for wafer-by-wafer analysis. At least one value of a controlled variable in said wafer-by-wafer analysis is identified. A trajectory of recipes is created for the identified semiconductor devices. A feedback implementation of wafer-by-wafer control is performed using the trajectory of recipes upon the identified semiconductor devices. A feed-forward implementation of wafer-by-wafer control is performed using the trajectory of recipes upon the identified semiconductor devices.

In another aspect of the present invention, an apparatus is provided for optimal wafer-by-wafer processing. The apparatus of the present invention comprises: means for identifying semiconductor devices for wafer-by-wafer analysis; means for identifying at least one value of a controlled variable in said wafer-by-wafer analysis; means for creating a trajectory of recipes for said identified semiconductor devices; means for performing a feedback implementation of wafer-by-wafer control using said trajectory of recipes upon said identified semiconductor devices; and means for performing a feed-forward implementation of wafer-by-wafer control using said trajectory of recipes upon said identified semiconductor devices.

BRIEF DESCRIPTION OF THE DRAWINGS

The invention may be understood by reference to the following description taken in conjunction with the accompanying drawings, in which like reference numerals identify like elements, and in which.

Figure 1:
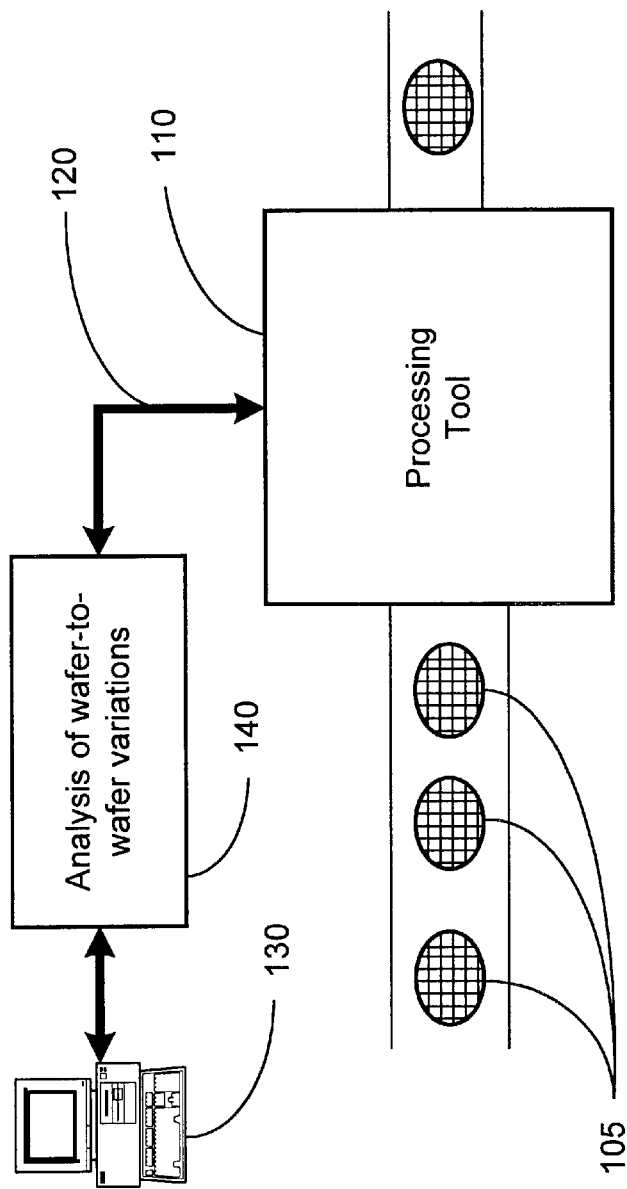
FIG. 1 illustrates one embodiment of the method taught by the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discreet processes that are involved in semiconductor manufacturing. Many times, semiconductor devices are stepped through multiple manufacturing process tools. Wafer-to-wafer variations can result in an output of non-uniform semiconductor devices. One process that is affected by is the photolithography overlay process. Overlay process is an important step in semiconductor manufacturing. In particular, overlay process involves measuring misalignment errors between semiconductor layers during manufacturing processes. Improvements in the overlay process could result in substantial enhancements, in terms of quality and efficiency, in semiconductor manufacturing processes. The present invention provides a method of implementing automated error correction for wafer-to-wafer variations.

Semiconductor devices are processed in a manufacturing environment using a number of input control parameters. Turning now to FIG. 1, in one embodiment, semiconductor products 105, such as semiconductor wafers, are processed on a processing tool 110, such as an exposure tool, using a plurality of control input signals (or control parameters) on a line 120. In one embodiment, the control input signals on the line 120 are sent to the processing tool 110 from a computer system 130. In one embodiment, the control input signals on the line 120 can be integrated into a manufacturing model that controls a manufacturing process. One example of a processing tool 110 used in semiconductor manufacturing processes is a stepper. The control input signals on the line 120 can be modified to reduce the effects of wafer-to-wafer variations on a set of semiconductor devices being processed, as described in block 140 of FIG. 1.

In the context of a manufacturing process such as a stepper process, the control inputs on the line 120 that are used to operate the processing tool 110 include an x-translation signal, a y-translation signal, an x-expansion wafer scale signal, a y-expansion wafer scale signal, a reticle magnification signal, and a reticle rotation signal. Generally, errors associated with the reticle magnification signal and the reticle rotation signal relate to one particular exposure process on the surface of the wafer being processed in the exposure tool. One of the primary features taught by the present invention is a method of updating control input signals on the line 120 in response to an analysis of external variables.

When a process step in the processing tool 110 is concluded, the semiconductor wafer that is being processed in the processing tool 110 is examined in a review station, as described in block 120 of FIG. 1. One such review station is a KLA® review station. One set of data derived from the operation of the review station is a quantitative measure of the amount of misregistration that was caused by the previous exposure process. In one embodiment, the amount of misregistration relates to the misalignment in the process that occurred between two layers of a semiconductor wafer. In one embodiment, the amount of misregistration that occurred can be attributed to the control inputs to a particular exposure process. The control inputs generally affect the accuracy of the process steps performed by the exposure tools on the semiconductor wafer. The control input signals affect the reticle magnification and the position of the semiconductor wafer that is being processed. Modifications of the control inputs can be utilized to improve the performance of the process steps employed in the exposure tool. In one embodiment, the modifications to the control input signals on the line 120 are based on the effects of external variables on the semiconductor devices being processed.

Figure 2:
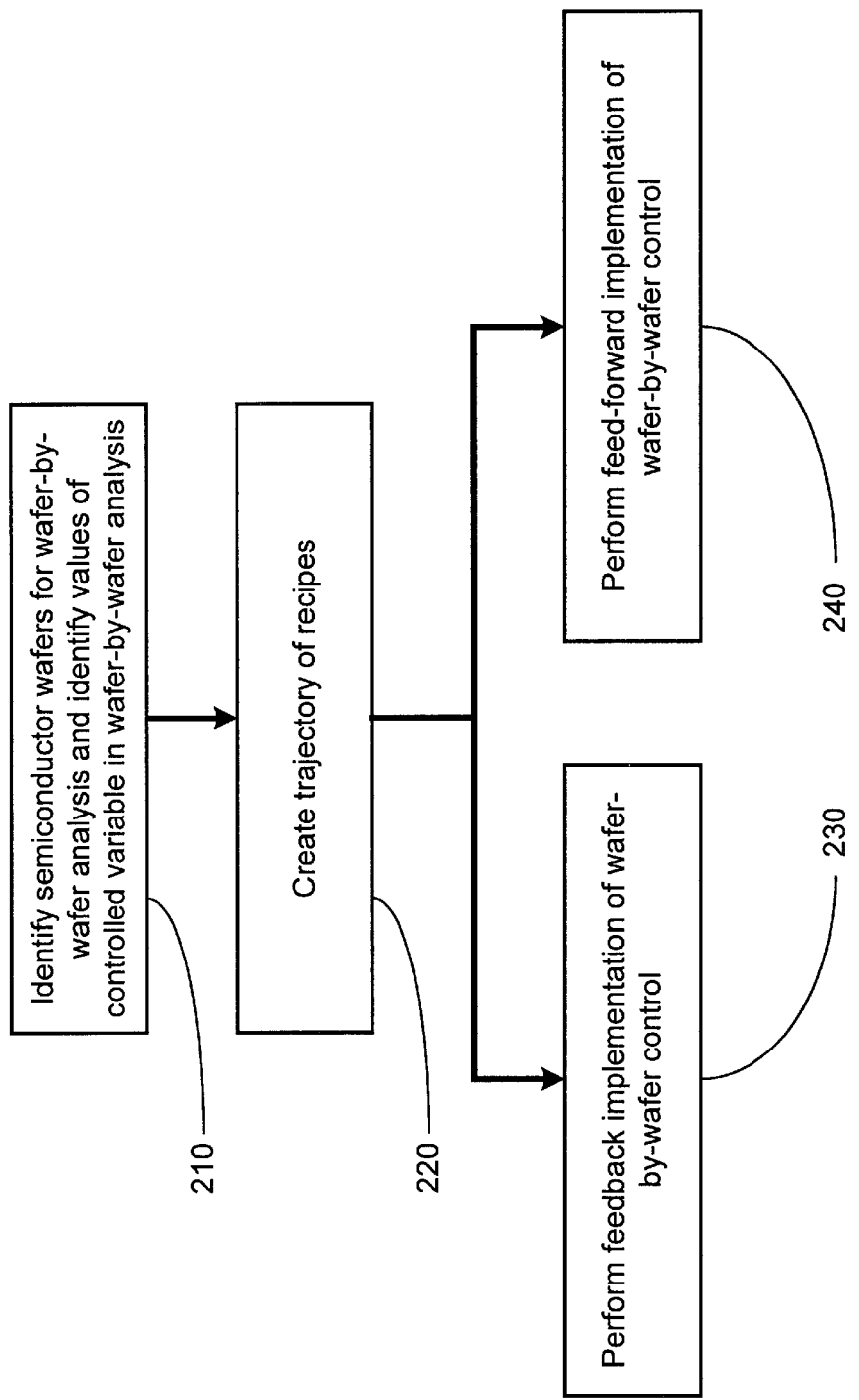
FIG. 2 illustrates a flowchart representation of the methods taught by the present invention.

Turning now to FIG. 2, a flowchart depiction of one embodiment of the present invention is illustrated. In one embodiment, a set of semiconductor wafers is selected for wafer-by-wafer analysis and values for controlled variables in the wafer-by-wafer analysis are identified, as described in block 210 of FIG. 2. In one embodiment, manufacturing process steps that are generally performed upon semiconductor wafers individually are chosen for wafer-by-wafer analysis. Generally, a significant amount of variance can occur from one wafer to another during manufacturing processes that involve wafer-by-wafer processing. In batch processing of semiconductor devices, multiple semiconductor wafers are processed simultaneously. Although the semiconductor wafers are processed simultaneously, variations from one wafer to another could occur, depending on the position of the semiconductor wafer.

Variations between semiconductor wafers can be caused by memory effects on the processing tool 110. The processing tool 110 may hold the remnants of a previous process and inadvertently implement modifications to a current process. Wafer-to-wafer variations can also occur due to start-up effects associated with the particular processing tool 110. Non-uniform delays between semiconductor wafer processing steps can also cause wafer-to-wafer variations. Furthermore, first-wafer effect can cause wafer-to-wafer variations. First-wafer effect refers to a general occurrence in semiconductor wafer processing where the first wafer often receives a slightly modified processing application compared to subsequent wafers. Wafer-to-wafer variations can cause non-uniform quality of semiconductor devices.

Once a set of semiconductor wafers is selected for wafer-by-wafer analysis, a trajectory of recipes is created, as described in block 220 of FIG. 2. In one embodiment, a trajectory of recipes comprises a sequence of recipes, such as a process recipe for each semiconductor wafer. In one embodiment, a recipe may contain a set of process instructions that includes multiple steps on different processing tools 110. Once a trajectory of recipes is generated, a feedback implementation of wafer-by-wafer control is performed, as described in block 230 of FIG. 2. In one embodiment, a feed-forward implementation of wafer-by-wafer control is also performed, as described in block 240 of FIG. 2.

In an alternative embodiment, the trajectory of recipe values for a given control variable are stored in a database (not shown), such as the data-store component of the APC framework. The recipe values are then changed in a given recipe by remote parameter setting as commanded by an external computer system to the recipe in a process tool, such as the computer system 130. For example, incoming thickness variations in a given lot of semiconductor wafers may require different etch times in a subsequent manufacturing operation for optimal processing. In the feed-forward embodiment described in FIG. 5, a single etch recipe is downloaded to the processing tool 110, 112 from a Manufacturing Execution System (MES) computer (not shown). Before each wafer is processed, the individual etch time period associated with a particular semiconductor wafer is set in the process recipe by remote parameter setting command from the MES computer. In one embodiment, the parameter setting is determined by utilizing the trajectory of the etch time period values for each given semiconductor wafer of the manufacturing lot stored in the data-store of a process control system such as the APC framework. Similarly, remote parameter settings can be also be used for wafer-to-wafer recipe variation in the feedback embodiment described in FIG. 3.

Figure 3:
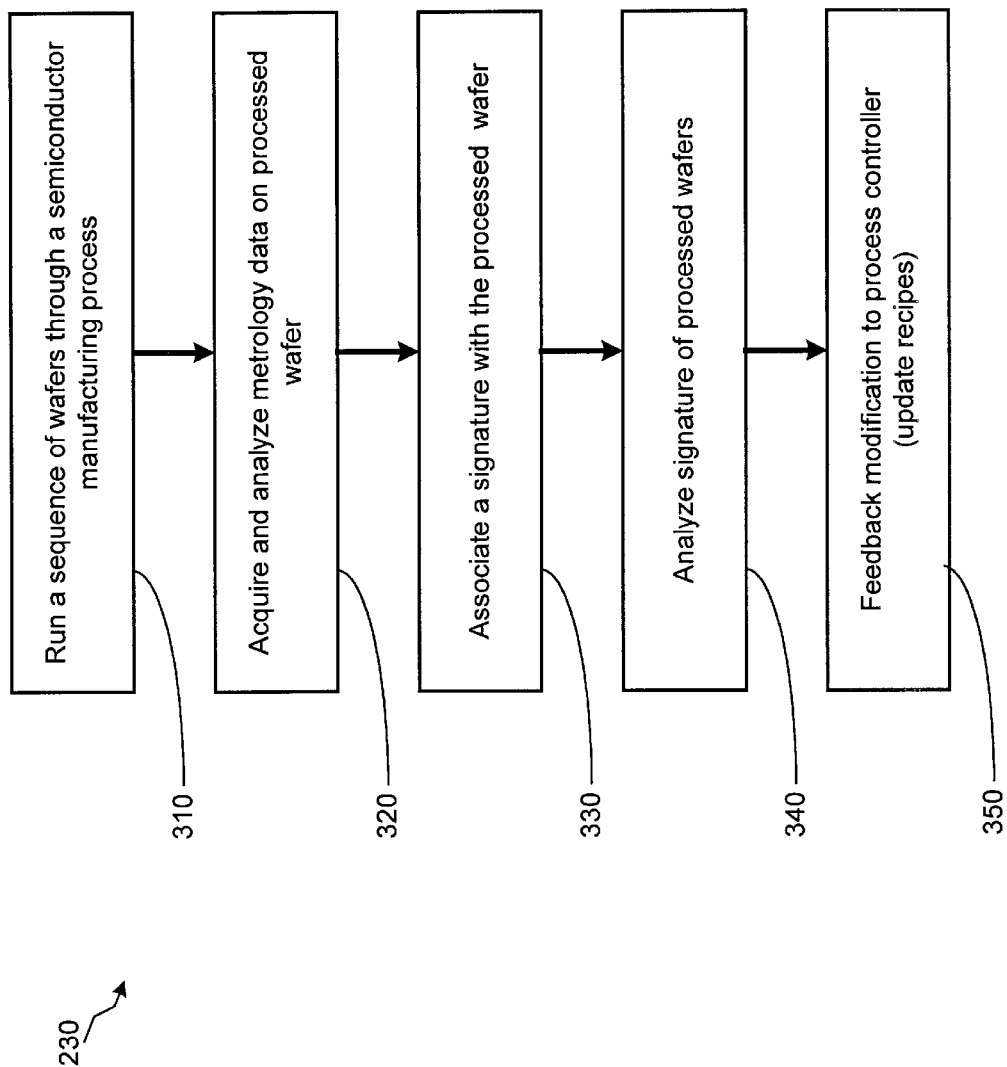
FIG. 3 depicts a flowchart representation of the feedback implementation described in FIG. 1.

Turning now to FIG. 3, one embodiment of the feedback implementation of the wafer-by-wafer control 230 is illustrated. A set of semiconductor wafers is run through a semiconductor manufacturing process, as described in block 310 of FIG. 3. In one embodiment, production data is stored and sorted by a process controller, such as the Advanced Process Controller (APC). Metrology data relating to a processed semiconductor wafer is acquired and analyzed, as described in block 320 of FIG. 3. Metrology data can be acquired on a post-process basis, a semiconductor device lot-by-lot basis, or sampled from a semiconductor device production line. In the case of photolithography overlay processes, semiconductor wafer characteristics, such as misregistration between multiple layers of the semiconductor wafer, are analyzed. For etching processes, semiconductor wafer characteristics, such as critical dimension errors, are analyzed. Metrology data can be used to modify control input signals on the line 120 to reduce semiconductor wafer errors.

In one embodiment, a signature is associated with a particular processed semiconductor wafer, as described in block 330 of FIG. 3. Process variations or semiconductor wafer characteristics can be used to associate a signature with particular wafers. For example, during an etching process, an initial group of semiconductor wafers may have critical dimensions that are slightly different from the critical dimensions of later processed semiconductor wafers. One cause of the critical dimension variation is the first-wafer effect, where initial semiconductor wafers are etched slightly more or less than subsequently processed semiconductor wafers.

Once a signature is associated with particular processed semiconductor wafers, the wafer signatures are analyzed so the modifications to the control system can be implemented, as described in block 340 of FIG. 3. For photolithography overlay processes, the misregistration signatures for particular wafers are analyzed so the subsequent semiconductor wafer process steps can be corrected. For etching processes, critical dimension signatures for particular semiconductor wafers are analyzed so the subsequent etching of semiconductor wafers can be performed with more precision.

Figure 4:
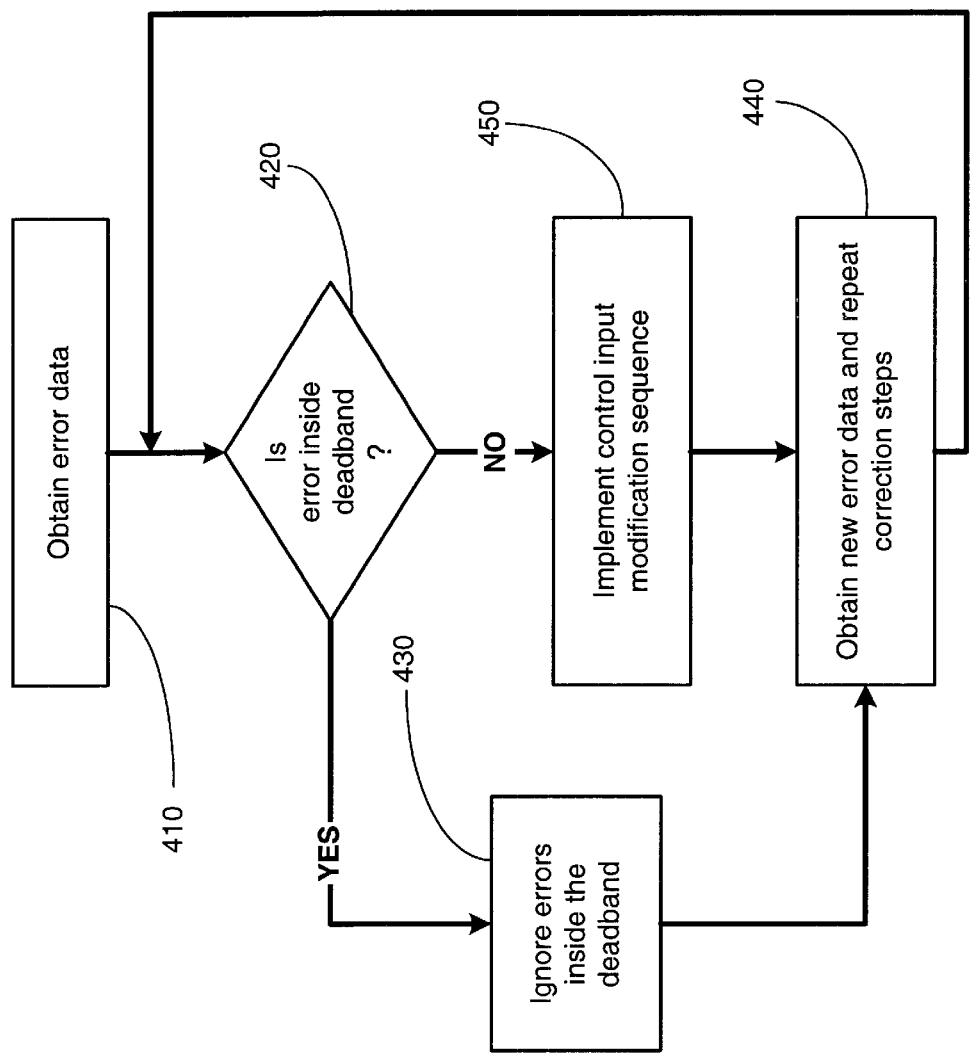
FIG. 4 illustrates in further detail, one embodiment of the control input signal modification sequence.

Once the signatures associated with particular semiconductor wafers are analyzed, modification of control inputs on a line 120 are fed back to the process controller, as described in block 350 of FIG. 3. The modification of the control parameters or control inputs on the line 120 reduces errors on subsequent semiconductor wafers in production. During the feedback process, process recipes are updated such that modifications are made to the production process of semiconductor wafers to reduce errors. Accordingly, a slightly different process recipe is used to process the first semiconductor wafer as compared to a latter semiconductor wafer that is processed. One method of modifying control input signals on the line 120 is illustrated in FIG. 4. Changes to control input signals can be made by those skilled in the art having the benefit of the present disclosure.

Turing now to FIG. 4, a flowchart depiction of one method of modifying control parameters is illustrated. Error data relating to processing of semiconductor devices is acquired, as described in block 410. Once the error data is acquired, a determination is made whether the error data is inside the deadband, as described in block 420 of FIG. 4. The step described in block 420 is performed in order to determine whether an error is sufficiently significant to warrant a change in the control inputs on the line 120. To define the deadband, the errors acquired from product analysis stations (not shown), such as the review station, are compared to a predetermined set of threshold parameters. In one embodiment, the deadband contains a range of error values associated with control input signals centered proximate to a set of corresponding predetermined target values, for which generally controller action is blocked. If any one of the errors acquired from the product analysis station is smaller than its corresponding predetermined threshold value, that particular error is deemed to be in the deadband. One of the primary purposes of the deadband is to prevent excessive control actions, resulting from changes to control input signals on the line 120, from causing a semiconductor manufacturing process to be inordinately jittery.

When a determination is made, as shown in block 420, that an error corresponding to a control input signal is inside the deadband, that particular error is ignored, as described in block 430 of FIG. 4. Therefore, when the value of an error that corresponds to a control input signal is found to be in the predetermined deadband, that particular error is not used to update its corresponding control input signal. New error data is then obtained and analyzed, as described in block 440 of FIG. 4. In one embodiment, the steps described above are repeated for the new error data that is obtained.

When a determination is made, as shown in block 420, that an error corresponding to a control input signal is not inside the deadband, further processing, such as implementing a control input modification sequence, is performed, as described in block 450 of FIG. 4. The value of the error corresponding to a control input signal is used to update that control input signal for a subsequent manufacturing process step.

Figure 5:
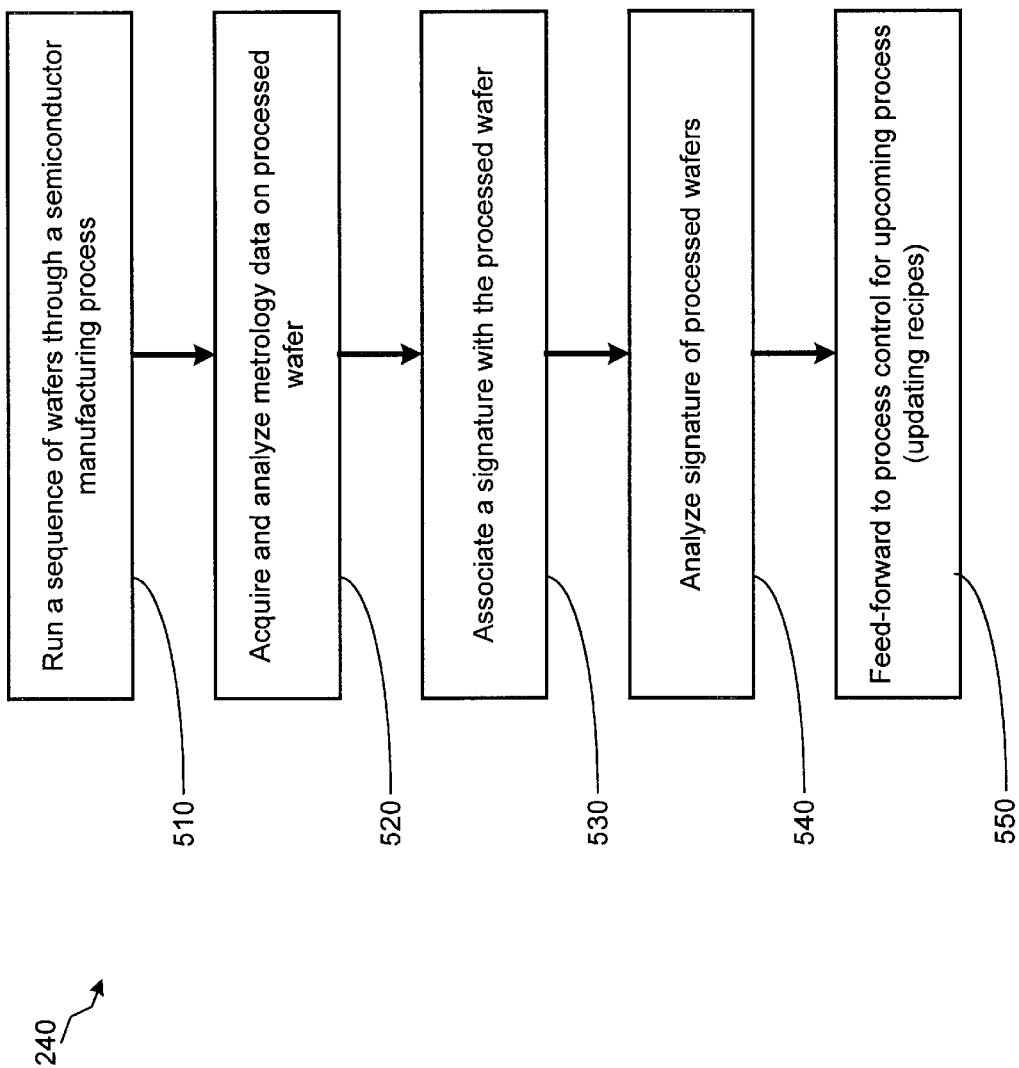
FIG. 5 depicts a flowchart representation of the feed-forward implementation described in FIG. 1.

Turning now to FIG. 5, one embodiment of the feedforward implementation of a wafer-by-wafer control 240 is illustrated. A set of semiconductor wafers are run through a semiconductor manufacturing process, as described in block 510 of FIG. 5. In one embodiment, production data is stored and sorted by a process controller, such as the Advanced Process Controller (APC). Metrology data relating to a processed semiconductor wafer is acquired and analyzed, as described in block 520 of FIG. 5. Metrology data can be acquired on a post-process basis, a semiconductor device lot-by-lot basis, or sampled from a semiconductor device production line. In the case of photolithography overlay processes, semiconductor wafer characteristics, such as misregistration between multiple layers of the semiconductor wafer, are analyzed. For etching processes, semiconductor wafer characteristics, such as critical dimension errors, are analyzed. Metrology data can be used to modify control input signals on the line 120 to reduce semiconductor wafer errors.

In one embodiment, a signature is associated with a particular processed semiconductor wafer, as described in block 530 of FIG. 5. Process variations or semiconductor wafer characteristics can be used to associate a signature with particular wafers. For example, during an etching process, an initial group of semiconductor wafers may have critical dimensions that are slightly different from the critical dimension of later processed semiconductor wafers. One cause of the critical dimension variation is the first-wafer effect, where initial semiconductor wafers are etched slightly more or less than subsequently processed semiconductor wafers.

Once a signature is associated with particular processed semiconductor wafers, the wafer signatures are analyzed so the modifications to control systems can be implemented, as described in block 540 of FIG. 5. For photolithography overlay processes, the misregistration signatures for particular wafers are analyzed so the subsequent semiconductor wafer process steps can be corrected. For etching processes, critical dimension signatures for particular semiconductor wafers are analyzed so the subsequent etching of semiconductor wafers can be performed with more precision.

Once the signatures associated with particular semiconductor wafers are analyzed, modification of the control inputs on the line 120 are fed forward to a subsequent process controller, as described in block 550 of FIG. 5. The modification of the control parameters or control inputs on the line 120 reduces errors on subsequent semiconductor wafers or the same semiconductor wafer in production. During the feed-forward process, process recipes are updated such that modifications are made to the production process of semiconductor wafers to reduce errors. Accordingly, a slightly different process recipe is used for a subsequent process to compensate for an error that may have occurred during a previous process step. For example, during deposition processes, initial semiconductor wafers, or wafers from specific area of a batch load of semiconductor wafers, may be slightly thicker than other processed semiconductor wafers in the same manufacturing lot. Therefore, a feed-forward step can be taken so that the next etch operation can perform the etching process for a slightly longer period of time on the initial semiconductor wafers identified as thicker than nominal for the lot of semiconductor wafers. One method of modifying the control input signals on the line 120 is to implement the steps described above and in FIG. 4. Changes to the control input signals can be made by those skilled in the art having the benefit of the present disclosure.

In one embodiment, control threads are utilized to control manufacturing processes. One method of using the updated control input signals on the line 120 is implemented by control threads. Control threads can be implemented by an overlay controller and an etching process tool. Control threads are a significant part of the control scheme of a semiconductor manufacturing tool such as the exposure tool. Each of the different control threads acts like a separate controller, and is differentiated by various process conditions. For overlay control, the control threads are separated by a combination of different conditions, including the semiconductor manufacturing tool (e.g., stepper) currently processing the wafer lot, the semiconductor product, the semiconductor manufacturing operation, and the semiconductor manufacturing tool that processes the semiconductor wafer lot at a previous layer of the wafer. Modifications to control threads are performed using the principles taught by the present invention.

The principles taught by the present invention can be implemented in an Advanced Process Control (APC) Framework. The APC is a preferred platform from which to implement the overlay control strategy taught by the present invention. In some embodiments, the APC can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for optimal wafer-by-wafer processing, comprising:

identifying semiconductor devices for wafer-by-wafer analysis;

identifying at least one value of a controlled variable in said wafer-by-wafer analysis;

creating a trajectory of recipes for said identified semiconductor devices;

performing a feedback implementation of wafer-by-wafer control using said trajectory of recipes upon said identified semiconductor devices; and performing a feed-forward implementation of wafer-by-wafer control using said trajectory of recipes upon said identified semiconductor devices.

2. The method described in claim 1, wherein identifying semiconductor devices for wafer-by-wafer analysis further comprises identifying semiconductor wafers for wafer-by-wafer analysis.

3. The method described in claim 2, wherein identifying semiconductor devices for wafer-by-wafer analysis further comprises identifying said semiconductor wafers that are processed individually.

4. The method described in claim 2, wherein identifying semiconductor devices for wafer-by-wafer analysis further comprises identifying said semiconductor wafers that are processed in semiconductor wafer batches.

5. The method described in claim 1, wherein performing feedback implementation of wafer-by-wafer control using said trajectory of recipes upon said identified semiconductor devices further comprises:

performing a process sequence of at least one semiconductor device through a manufacturing process;

acquiring metrology data for said processed semiconductor device;

analyzing metrology data for said processed semiconductor device;

associating a signature with said processed semiconductor device using said analyzed metrology data and said analyzed metrology data; and performing a feedback process upon a process controller based upon said signature associated with said processed semiconductor device.

6. The method described in claim 5, wherein performing a process sequence of at least one semiconductor device through a manufacturing process further comprises performing a photolithography overlay process.

7. The method described in claim 5, wherein performing a process sequence of at least one semiconductor device through a manufacturing process further comprises performing an etching process.

8. The method described in claim 5, wherein acquiring metrology data for said processed semiconductor device further comprises acquiring production data.

9. The method described in claim 5, wherein analyzing metrology data for said processed semiconductor device further comprises analyzing error data.

10. The method described in claim 5, wherein performing a feedback process upon a process controller further comprises modifying control parameters.

11. The method described in claim 5, wherein modifying control parameters further comprises modifying a control thread.

12. The method described in claim 5, wherein performing a feedback process upon a process controller further comprises performing a feedback process upon an Advanced Process Controller (APC).

13. The method described in claim 1, wherein performing feed-forward implementation of wafer-by-wafer control using said trajectory of recipes upon said identified semiconductor devices further comprises:

performing a process sequence of at least one semiconductor device through a manufacturing process;

acquiring metrology data for said processed semiconductor device;

analyzing metrology data for said processed semiconductor device;

associating a signature with said processed semiconductor devices using said analyzed metrology data and said analyzed metrology data; and performing a feed-forward process upon a process controller based upon said signature associated with said processed semiconductor device.

14. The method described in claim 13, wherein performing a process sequence of at least one semiconductor device through a manufacturing process further comprises performing a photolithography overlay process.

15. The method described in claim 13, wherein performing a process sequence of at least one semiconductor device through a manufacturing process further comprises performing an etching process.

16. The method described in claim 13, wherein acquiring metrology data for said processed semiconductor device further comprises acquiring production data.

17. The method described in claim 13, wherein analyzing metrology data for said processed semiconductor device further comprises analyzing error data.

18. The method described in claim 13, wherein performing a feed-forward process upon a process controller further comprises modifying control parameters.

19. The method described in claim 13, wherein modifying control parameters further comprises modifying a control thread.

20. The method described in claim 5, wherein performing a feed-forward process upon a process controller further comprises performing a feed-forward process upon an Advanced Process Controller (APC).

21. An apparatus for optimal wafer-by-wafer processing, comprising:

means for identifying semiconductor devices for wafer-by-wafer analysis;

means for identifying at least one value of a controlled variable in said wafer-by-wafer analysis;

means for creating a trajectory of recipes for said identified semiconductor devices;

means for performing a feedback implementation of wafer-by-wafer control using said trajectory of recipes upon said identified semiconductor devices; and means for performing a feed-forward implementation of wafer-by-wafer control using said trajectory of recipes upon said identified semiconductor devices.

22. A computer readable program storage device encoded with instructions that, when executed by a computer, performs a method for optimal wafer-by-wafer processing, comprising:

identifying semiconductor devices for wafer-by-wafer analysis;

identifying at least one value of a controlled variable in said wafer-by-wafer analysis creating a trajectory of recipes for said identified semiconductor devices;

performing a feedback implementation of wafer-by-wafer control using said trajectory of recipes upon said identified semiconductor devices; and performing a feed-forward implementation of wafer-by-wafer control using said trajectory of recipes upon said identified semiconductor devices.

23. The computer readable program storage device encoded with instructions that, when executed by a computer, performs the method described in claim 22, wherein identifying semiconductor devices for wafer-by-wafer analysis further comprises identifying semiconductor wafers for wafer-by-wafer analysis.

24. The computer readable program storage device encoded with instructions that, when executed by a computer, performs the method described in claim 23, wherein identifying semiconductor devices for wafer-by-wafer analysis further comprises identifying said semiconductor wafers that are processed individually.

25. The computer readable program storage device encoded with instructions that, when executed by a computer, performs the method described in claim 23, wherein identifying semiconductor devices for wafer-by-wafer analysis further comprises identifying said semiconductor wafers that are processed in semiconductor wafer batches.

26. The computer readable program storage device encoded with instructions that, when executed by a computer, performs the method described in claim 22, wherein performing feedback implementation of wafer-by-wafer control using said trajectory of recipes upon said identified semiconductor devices further comprises:

performing a process sequence of at least one semiconductor device through a manufacturing process;

acquiring metrology data for said processed semiconductor device;

analyzing metrology data for said processed semiconductor device;

associating a signature with said processed semiconductor device using said analyzed metrology data and said analyzed metrology data; and performing a feedback process upon a process controller based upon said signature associated with said processed semiconductor device.

27. The computer readable program storage device encoded with instructions that, when executed by a computer, performs the method described in claim 26, wherein performing a process sequence of at least one semiconductor device through a manufacturing process further comprises performing a photolithography overlay process.

28. The computer readable program storage device encoded with instructions that, when executed by a computer, performs the method described in claim 26, wherein performing a process sequence of at least one semiconductor device through a manufacturing process further comprises performing an etching process.

29. The computer readable program storage device encoded with instructions that, when executed by a computer, performs the method described in claim 26, wherein acquiring metrology data for said processed semiconductor device further comprises acquiring production data.

30. The computer readable program storage device encoded with instructions that, when executed by a computer, performs the method described in claim 26, wherein analyzing metrology data for said processed semiconductor device further comprises analyzing error data.

31. The computer readable program storage device encoded with instructions that, when executed by a computer, performs the method described in claim 26, wherein performing a feedback process upon a process controller further comprises modifying control parameters.

32. The computer readable program storage device encoded with instructions that, when executed by a computer, performs the method described in claim 26, wherein modifying control parameters further comprises modifying a control thread.

33. The computer readable program storage device encoded with instructions that, when executed by a computer, performs the method described in claim 26, wherein performing a feedback process upon a process controller further comprises performing a feedback process upon an Advanced Process Controller (APC).

34. The computer readable program storage device encoded with instructions that, when executed by a computer, performs the method described in claim 22, wherein performing feed-forward implementation of wafer-by-wafer control using said trajectory of recipes upon said identified semiconductor devices further comprises:

performing a process sequence of at least one semiconductor device through a manufacturing process;

acquiring metrology data for said processed semiconductor device;

analyzing metrology data for said processed semiconductor device;

associating a signature with said processed semiconductor devices using said analyzed metrology data and said analyzed metrology data; and performing a feed-forward process upon a process controller based upon said signature associated with said processed semiconductor device.

35. The computer readable program storage device encoded with instructions that, when executed by a computer, performs the method described in claim 34, wherein performing a process sequence of at least one semiconductor device through a manufacturing process further comprises performing a photolithography overlay process.

36. The computer readable program storage device encoded with instructions that, when executed by a computer, performs the method described in claim 34, wherein performing a process sequence of at least one semiconductor device through a manufacturing process further comprises performing an etching process.

37. The computer readable program storage device encoded with instructions that, when executed by a computer, performs the method described in claim 34, wherein acquiring metrology data for said processed semiconductor device further comprises acquiring production data.

38. The computer readable program storage device encoded with instructions that, when executed by a computer, performs the method described in claim 34, wherein analyzing metrology data for said processed semiconductor device further comprises analyzing error data.

39. The computer readable program storage device encoded with instructions that, when executed by a computer, performs the method described in claim 34, wherein performing a feed-forward process upon a process controller further comprises modifying control parameters.

40. The computer readable program storage device encoded with instructions that, when executed by a computer, performs the method described in claim 34, wherein modifying control parameters further comprises modifying a control thread.

41. The computer readable program storage device encoded with instructions that, when executed by a computer, performs the method described in claim 34, wherein performing a feed-forward process upon a process controller further comprises performing a feed-forward process upon an Advanced Process Controller (APC).

* * * * *